(12) United States Patent
Ito

(10) Patent No.: US 6,323,438 B1
(45) Date of Patent: Nov. 27, 2001

(54) PRINTED CIRCUIT BOARD AND SEMICONDUCTOR DEVICE USING THE SAME

(75) Inventor: Hitoshi Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/328,411

(22) Filed: Jun. 9, 1999

(30) Foreign Application Priority Data

Jun. 10, 1998 (JP) .................................................. 10-161626

(51) Int. Cl.⁷ ..................................................... H01R 12/04
(52) U.S. Cl. ........................... 174/261; 174/251; 174/255; 174/263
(58) Field of Search .................................. 174/251, 255, 174/261, 263; 29/739, 740

(56) References Cited

U.S. PATENT DOCUMENTS

| | | | |
|---|---|---|---|
| 5,027,188 | * 6/1991 | Owada et al. ........................... | 357/68 |
| 5,223,454 | * 6/1993 | Uda et al. .............................. | 437/189 |
| 5,408,383 | * 4/1995 | Nagaska et al. ...................... | 361/707 |
| 5,442,236 | * 8/1995 | Fuzakawa ............................. | 257/758 |

* cited by examiner

Primary Examiner—Jeffrey Gaffin
Assistant Examiner—José H. Alcalá
(74) Attorney, Agent, or Firm—Sonnenschein, Nath & Rosenthal

(57) ABSTRACT

A semiconductor device with a dummy wiring pattern. The semiconductor device is capable of stabilizing the adhesively bonding state of a semiconductor element in which a semiconductor element is mounted on the printed circuit board. The printed circuit board includes a wiring pattern and an element mounting portion on which the semiconductor element is to be mounted and is fixed using an adhesive, wherein a dummy wiring pattern having a thickness nearly equal to that of the wiring pattern is provided on the element mounting portion and the semiconductor element is mounted on the dummy wiring pattern via the adhesive.

16 Claims, 2 Drawing Sheets

PRINTED CIRCUIT BOARD AND SEMICONDUCTOR DEVICE USING THE SAME

RELATED APPLICATION DATA

The present application claims priority to Japanese Application No. P10-161626 filed Jun. 10, 1998, which application is incorporated herein by reference to the extent permitted by law.

BACKGROUND OF THE INVENTION

The present invention relates to a printed circuit board having a wiring pattern and a semiconductor device in which a semiconductor element is mounted on an element mounting portion of the printed circuit board.

As one type of semiconductor devices in which a semiconductor element is mounted on a printed circuit board, there is known a structure called a BGA (Ball Grid Array), for example, shown in FIG. 1. In this figure, reference numeral 1 designates a semiconductor device in which a semiconductor element 3 is mounted on a printed circuit board 2 and is sealed with a resin 4.

The printed circuit board 2 is formed into a square shape as shown in FIG. 2, in which a number of electrical wiring patterns 5 are arranged at a peripheral portion. An element mounting portion 6 on which the above semiconductor element 3 is to be mounted is defined at a central portion of the printed circuit board 2, that is, a portion surrounded by the number of electrical wiring patterns 5.

A solder resist portion 7 is, as shown in FIG. 1, provided on the electrical wiring patterns 5 and the element mounting portion 6 on the printed circuit board 2, and the semiconductor element 3 is mounted on the solder resist portion 7 at a location directly over the element mounting portion 6. The semiconductor element 3 is bonded on the solder resist portion 7 with an adhesive 8, to be thus mounted on the element mounting portion 6 via the solder resist portion 7.

As the adhesive 8, there is used a conductive adhesive such as a silver paste or an insulating adhesive.

In FIG. 1, reference numeral 9 designates gold wires for electrically connecting the semiconductor element 3 to the electrical wiring patterns 5, and 10 is solder balls electrically connected to the electrical wiring patterns 5.

In the semiconductor device 1, the semiconductor element 3 is positioned not only directly over the element mounting portion 6 on which the electrical wiring patterns 5 are absent, but also directly over part of the electrical wiring patterns 5, and accordingly a surface area, on which the semiconductor element 3 is mounted, of the solder resist portion 7 is irregularly raised by part of the electrical wiring patterns 5 located under the surface area of the solder resist portion 7, to form large steps on the surface area of the solder resist portion 7.

The formation of such large steps on the solder resist portion 7, however, has a problem. Namely, by the presence of the large steps, the adhesive 8 for bonding the semiconductor element 3 on the solder resist portion 7 causes a large variation in its coating state such as the coating thickness or spread of wetting. To be more specific, as shown in FIG. 1, at the area directly over the element mounting portion 6 on which the electrical wiring patterns 5 are absent, even if the coating amount of the adhesive 8 is increased, the spread of wetting of the adhesive 8 is hard to occur; while at the area directly over the electrical wiring patterns 5, if the coating amount of the adhesive 8 is decreased, the spread of wetting of the adhesive 8 becomes excessively large.

The variation in coating state of the adhesive 8 at the bonding portion of the semiconductor element 3 obstructs obtainment of a stable adhesion strength of the semiconductor element 3 to the printed wiring board 2, and also causes cracks in the semiconductor element 1 upon reflow, to thereby harm stabilization of the quality of the semiconductor device.

SUMMARY OF THE INVENTION

An object of the present invention is to provide a printed circuit board capable of stabilizing the adhesively bonding state of a semiconductor element on the printed circuit board, thereby improving the quality of a semiconductor device upon mounting of the semiconductor device, and a semiconductor device using the printed circuit board.

In an embodiment, the present invention provides a semiconductor device comprising a printed circuit board having an element mounting portion. Further, a wiring pattern is arranged at peripheral portions of the printed circuit board. The present invention also comprises a dummy wiring pattern centrally disposed over the element mounting portion wherein the dummy wiring pattern has a height substantially equal to that of the wiring pattern. A solder resist portion is disposed over the wiring pattern and dummy pattern in which the solder resist portion being is supported substantially uniform by the wiring pattern and the dummy pattern. Further, a semiconductor element is bonded substantially flat above the solder resist portion.

With this configuration, since the dummy wiring pattern having a thickness nearly equal to that of the wiring pattern is provided on the element mounting portion, the height of a semiconductor element mounting plane on the element mounting portion provided with the dummy wiring pattern is nearly equal to the height of a semiconductor element mounting plane on the wiring pattern, so that it is possible to prevent occurrence of large steps on the semiconductor element mounting plane.

According to a second aspect of the present invention, there is provided a semiconductor device including: a printed circuit board having a wiring pattern and an element mounting portion; and a semiconductor element fixed on said element mounting portion using an adhesive; wherein a dummy wiring pattern having a thickness nearly equal to that of said wiring pattern is provided on said element mounting portion.

In an embodiment, the present invention provides a semiconductor device comprising a printed circuit board having element mounting portion. Further, a wiring pattern is arranged at peripheral portions of the printed circuit board. The present invention also comprises a dummy wiring pattern, having irregularities, centrally disposed over the element mounting portion wherein the dummy wiring pattern has a height substantially equal to that of the wiring pattern. Further, a solder resist portion is disposed over the wiring pattern and dummy pattern in which the solder resist portion is supported substantially uniform by the wiring pattern and the dummy pattern to prevent large variations of thickness of the solder resist portion. The solder resist portion adheres to the irregularities of the dummy wiring pattern. A semiconductor element is bonded substantially flat above the solder resist portion by an adhesive wherein the adhesive is configured to the semiconductor element without a gap therebetween to enhance the wettability of the adhesive to the semiconductor element.

DETAILED DESCRIPTION OF THE PREFERRED EMBODIMENTS

Figure 1:
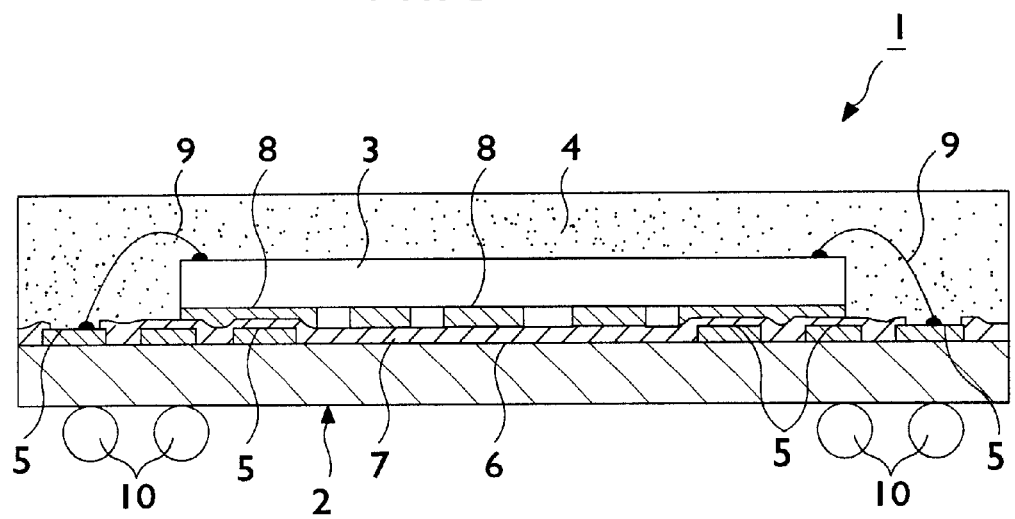
FIG. 1 is a sectional view of an essential portion showing a schematic configuration of one example of a related art semiconductor device.
Figure 2:
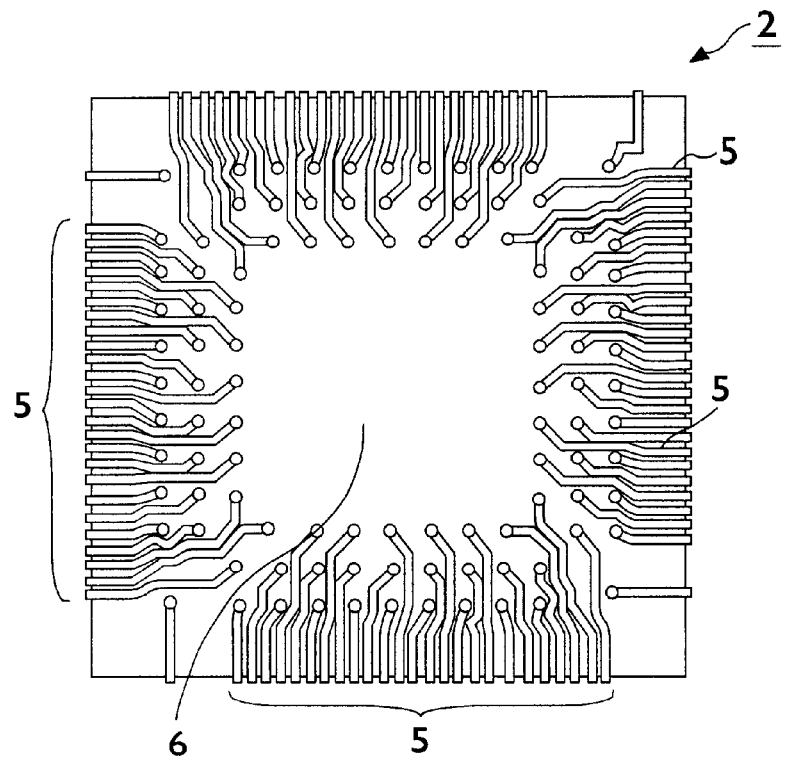
FIG. 2 is a plan view illustrating one example of a related art printed circuit board.
Figure 3:
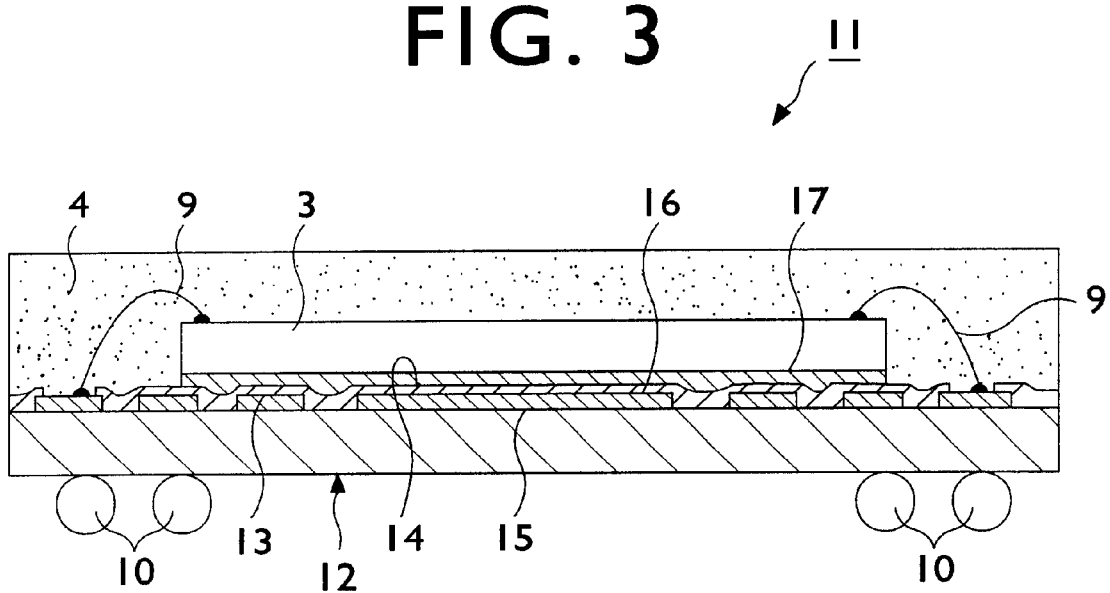
FIG. 3 is a sectional view of an essential portion showing a schematic configuration of one embodiment of a semiconductor device of the present invention.

FIG. 3 is a view showing one embodiment of a semiconductor device of the present invention. In this figure, reference 11 designates a semiconductor device of the same BGA (Ball Grid Array) structure as that of the semiconductor device 1 shown in FIG. 1, in which a semiconductor element 3 is mounted on a printed circuit board 12 and is sealed with a resin 4.

Figure 4:
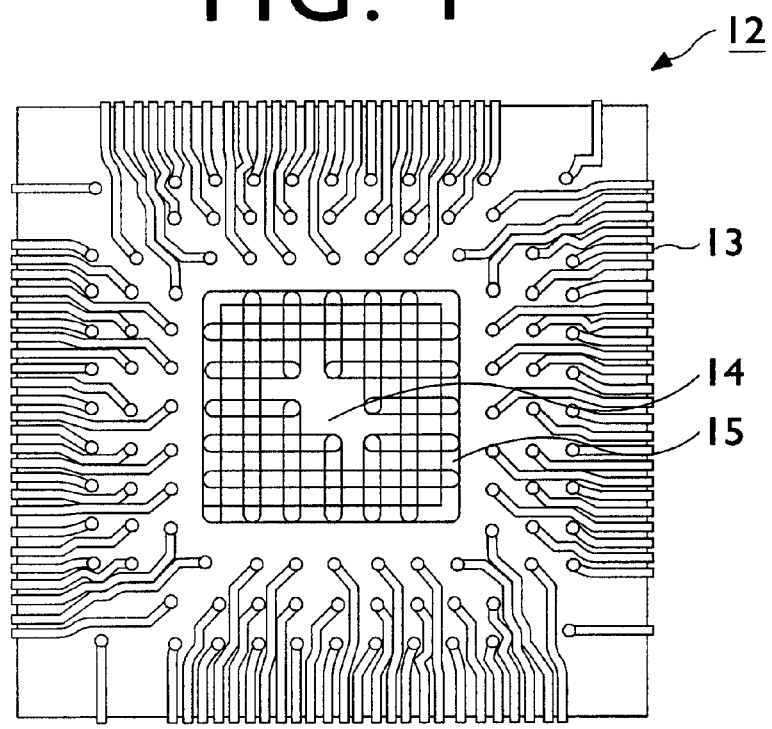
FIG. 4 is a plan view illustrating one embodiment of a printed circuit board of the present invention.

The printed circuit board 12, which is one embodiment of the printed circuit board of the present invention, is formed into a square shape as shown in FIG. 4. In this printed circuit board 12, electrical wiring patterns 13 formed by etching are arranged at a peripheral portion and a dummy wiring pattern 15 is formed at a central portion, that is, at an element mounting portion 14 surrounded by the electrical wiring patterns 13.

The dummy wiring pattern 15 is formed into a grid shape composed of a square frame and vertical and horizontal straight lines connecting opposed sides of the frame to each other. The straight lines are not too closely fitted with no gap but intermittently arranged in the plane direction of the printed circuit board 12. The dummy wiring pattern 15 is formed, simultaneously with formation of the electrical wiring patterns 13, by forming a film of a metal such as copper on the surface of the printed circuit board 12 by sputtering or the like and patterning the metal film into the grid pattern by known lithography and etching. Accordingly, the height of the dummy wiring pattern 15 is nearly equal to that of the electrical wiring patterns 13.

A continuous film-like solder resist portion 16 is, as shown in FIG. 3, provided on the electrical wiring patterns 13 and the dummy wiring pattern 15 on the printed circuit board 12. The semiconductor element 3 is mounted on the solder resist portion 16 at a location directly over the element mounting portion 14, that is, directly over both the dummy wiring pattern 15 and part of the electrical wiring patterns 13, and is bonded thereto with an adhesive 17.

As the adhesive 17, any one of various conductive adhesives and insulating adhesives may be used, and in this embodiment, silver paste is used.

Even in this embodiment, active portions of the semiconductor element 3 and the electrical wiring patterns 13 are extracted to the underside of the printed circuit board 12 via through-holes (not shown) formed in the printed circuit board 12, and are electrically connected to solder balls 10.

In this configuration, the surface of the solder resist portion 16 on which the semiconductor element 3 is mounted, that is, the semiconductor element mounting plane has no large step because the dummy wiring pattern 15 as the underlayer is substantially at the same level of height as that of part of the electrically wiring patterns 13. As a result, the adhesive 17 can be applied on the semiconductor element mounting plane of the solder resist portion 16 for bonding the semiconductor element 3 to the semiconductor element mounting plane without occurrence of a large variation in coating state of the adhesive 17 such as the thickness and spread of wetting. To be more specific, the spread of wetting of the adhesive 17 on the dummy wiring pattern 15 is substantially the same as that of part of the electrical wiring patterns 13.

Accordingly, in this semiconductor device 11, it is possible to equalize the coating state of the adhesive 17, and hence to stabilize the adhesively bonding state of the semiconductor element 3 on the printed circuit board 12. This is effective to improve the quality of the semiconductor device 11 upon assembly and mounting of the device 11.

Since the dummy wiring pattern 15 is formed into the grid shape composed of the straight lines intermittently arranged in both the vertical and horizontal directions of the printed circuit board 12, not large steps but small irregularities are formed on the surface of the solder resist portion 16 on the dummy wiring pattern 15, that is, on the semiconductor element mounting plane by the effect of the pattern shape of the dummy wiring pattern 15. This makes it possible to enhance the wettability of the adhesive 17, and hence to improve the adhesion strength of the semiconductor element 3 to the solder resist portion 16 via the adhesive 17.

With the printed circuit board 12, it is possible to stabilize the adhesively bonding state of the semiconductor element 3 to the printed circuit board 12 by equalizing the coating state of the adhesive 17, and hence to improve the quality of the semiconductor device 11 using the printed circuit board 12 upon assembly and mounting of the device 11. Further, since the dummy wiring pattern 15 is formed into the grid shape, as described above, it is possible to improve the adhesion strength of the semiconductor element 3 to the solder resist portion 16 via the adhesive 17.

While the dummy wiring pattern 15 is formed into the grid shape in the above embodiment, the present invention is not limited thereto. For example, the dummy wiring pattern 15 may be formed in a continuous solid state in the plane direction of the printed circuit board 12, or may be formed into a radial shape having components intermittently arranged in the plane direction of the printed circuit board 12.

In the above embodiment, the solder resist portion 16 is formed into a continuous film-shape, that is, a solid state; however, like the dummy wiring pattern 15, the solder resist portion 16 may be formed into a grid pattern having straight lines intermittently arranged in the plane direction of the printed circuit board 12. In this case, the wettability of the adhesive 17 can be improved by small irregularities formed by the intermittently arranged straight lines of the solder resist portion 16, so that it is possible to improve the adhesion strength of the semiconductor element 3 to the solder resist portion 16 via the adhesive 17.

Although the present invention is applied to the semiconductor device of the BGA structure in the above embodiment, it may be applied to a semiconductor device of a LGA (Land Grid Array) structure.

The printed circuit board of the present invention, generally formed into a quadrangle shape, is formed into a square shape in the above embodiment; however, it may be formed into a rectangular shape.

While the preferred embodiments of the present invention have been described using the specific terms, such description is for illustrative purposes only, and it is to be understood that changes and variations may be made without departing from the spirit or scope of the following claims.

What is claimed is:

1. A semiconductor device, comprising:

a printed circuit board having an element mounting portion;

a wiring pattern arranged on at least one peripheral portion of the printed circuit board;

a dummy wiring pattern centrally disposed within the element mounting portion, the dummy wiring pattern having a height substantially equal to that of the wiring pattern;

a solder resist portion disposed over the wiring pattern and dummy wiring pattern, the solder resist portion being supported substantially uniformly by the wiring pattern and the dummy wiring pattern; and a semiconductor element bonded above the solder resist portion, the semiconductor element being bonded substantially flat to the solder resist portion.

2. The semiconductor device according to claim 1, wherein the semiconductor element is bonded by an adhesive, the adhesive being bonded to the semiconductor element without a gap therebetween.

3. The semiconductor device according to claim 2, wherein the adhesive is applied to the solder resist portion without large variation in thickness of the adhesive.

4. The semiconductor device according to claim 3, wherein the dummy wiring pattern has small irregularities, the small irregularities configured to enhance adhesion strength between the solder resist portion and the semiconductor element via the adhesive.

5. The semiconductor device according to claim 1, wherein the semiconductor element is mounted to the solder resist portion directly over the element mounting portion.

6. The semiconductor device according to claim 1, wherein the semiconductor element is mounted directly over the dummy wiring pattern and partly over the wiring pattern.

7. The semiconductor device according to claim 1, wherein the dummy wiring pattern is arranged intermittently on the printed circuit board.

8. The semiconductor device according to claim 1, wherein the solder resist portion is arranged intermittently on the printed circuit board by the dummy wiring pattern and the wiring pattern.

9. The semiconductor device according to claim 1, wherein the dummy wiring pattern is grid shaped.

10. The semiconductor device according to claim 1, wherein the dummy wiring pattern is solid state shaped.

11. The semiconductor device according to claim 1, wherein the dummy wiring pattern is radial shaped.

12. The semiconductor device according to claim 1, wherein the solder resist portion is solid state shaped.

13. The semiconductor device according to claim 1, wherein the solder resist portion is grid shaped.

14. A semiconductor device, comprising:

a printed circuit board having an element mounting portion;

a wiring pattern arranged on at least one peripheral portion of the printed circuit board;

a dummy wiring pattern centrally disposed within the element mounting portion, the dummy wiring pattern having a height substantially equal to that of the wiring pattern, the dummy wiring pattern further having irregularities;

a solder resist portion disposed over the wiring pattern and dummy wiring pattern, the solder resist portion being supported substantially uniformly by the wiring pattern and the dummy wiring pattern to prevent large variations of thickness of the solder resist portion, the solder resist portion adhering to the irregularities of the dummy wiring pattern; and a semiconductor element bonded above the solder resist portion, the semiconductor element being bonded substantially flat to the solder resist portion by an adhesive, the adhesive being bonded to the semiconductor element without a gap therebetween to enhance the wettability of the adhesive to the semiconductor element.

15. The semiconductor device of claim 14, wherein the semiconductor element is mounted to the solder resist portion directly over the element mounting portion.

16. The semiconductor device of claim 14, wherein the adhesive is applied to the solder resist portion without large variation in thickness of the adhesive.

* * * * *